United States Patent
Wang et al.

(10) Patent No.: US 9,634,772 B2
(45) Date of Patent: Apr. 25, 2017

(54) HARMONIC SUPPRESSION SYSTEM

(71) Applicant: Huawei Device Co., Ltd., Shenzhen (CN)

(72) Inventors: Yongchao Wang, Xi'an (CN); Hui Zhang, Shenzhen (CN); Feng Dong, Xi'an (CN); Yajun Wang, Xi'an (CN); Yueyun Cheng, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 14/955,525

(22) Filed: Dec. 1, 2015

(65) Prior Publication Data

US 2016/0094299 A1  Mar. 31, 2016

Related U.S. Application Data (63) Continuation of application No. PCT/CN2014/080589, filed on Jun. 24, 2014.

(30) Foreign Application Priority Data

Jun. 27, 2013 (CN) .......................... 2013 1 0271810

(51) Int. Cl.
*H04B 1/04* (2006.01)
*H04B 15/00* (2006.01)
(Continued)

(52) U.S. Cl.
CPC .............. *H04B 15/00* (2013.01); *H01R 13/73* (2013.01); *H03J 5/24* (2013.01)

(58) Field of Classification Search
CPC ............ H01R 13/73; H03J 5/24; H04B 15/00
(Continued)

(56) References Cited

U.S. PATENT DOCUMENTS 6,317,608 B1  11/2001 Glocker
6,400,963 B1  6/2002 Gloeckler et al.
(Continued)

FOREIGN PATENT DOCUMENTS

CN  1302480 A  7/2001
CN  1860691 A  11/2006
(Continued)

OTHER PUBLICATIONS

Foreign Communication From a Counterpart Application, Chinese Application No. 201310271810.6, Chinese Office Action dated Apr. 13, 2016, 7 pages.
(Continued)

*Primary Examiner* — Xin Jia
(74) *Attorney, Agent, or Firm* — Conley Rose, P.C.

(57) ABSTRACT

A harmonic suppression system, including an interface connector is connected to a common end of a first differential SPMT switch; a control port of the first differential SPMT switch is connected to a control port of a second differential SPMT switch, and a gating throw end of the first differential SPMT switch is separately connected to one end of each LC trap network in a one-to-one correspondence; the control port of the second differential SPMT switch is connected to a baseband chip, each gating throw end of the second differential SPMT switch is separately connected to the other end of each LC trap network in a one-to-one correspondence, and a common end of the second differential SPMT switch is connected to the baseband chip; the baseband chip is connected to an antenna switch; and the antenna switch is connected to a antenna.

9 Claims, 3 Drawing Sheets

(51) Int. Cl.
*H03J 5/24* (2006.01)
*H01R 13/73* (2006.01)

(58) Field of Classification Search
USPC .................................................... 455/114.1
See application file for complete search history.

(56) References Cited

U.S. PATENT DOCUMENTS

| | | |
|---|---|---|
| 2005/0024544 A1 | 2/2005 | Waight et al. |
| 2006/0135083 A1 | 6/2006 | Leinonen et al. |
| 2007/0082622 A1 | 4/2007 | Leinonen et al. |
| 2012/0243447 A1 | 9/2012 | Weissman et al. |
| 2013/0154761 A1 | 6/2013 | Ilkov |

FOREIGN PATENT DOCUMENTS

| | | |
|---|---|---|
| CN | 101116253 A | 1/2008 |
| EP | 1220460 A2 | 7/2002 |
| EP | 2157698 A1 | 2/2010 |

OTHER PUBLICATIONS

Foreign Communication From a Counterpart Application, European Application No. 14818794.1, Extended European Search Report dated Apr. 26, 2016, 9 pages.
Foreign Communication From a Counterpart Application, PCT Application No. PCT/CN2014/080589, English Translation of International Search Report dated Sep. 12, 2014, 2 pages.
Foreign Communication From a Counterpart Application, PCT Application No. PCT/CN2014/080589, English Translation of Written Opinion dated Sep. 12, 2014, 8 pages.

HARMONIC SUPPRESSION SYSTEM

CROSS-REFERENCE TO RELATED APPLICATION

This application is a continuation of International Application No. PCT/CN2014/080589, filed on Jun. 24, 2014, which claims priority to Chinese Patent Application No. 201310271810.6, filed on Jun. 27, 2013, both of which are hereby incorporated by reference in their entireties.

TECHNICAL FIELD

The present disclosure relates to the field of communications technologies, and in particular, to a harmonic suppression system.

BACKGROUND

Figure 1:
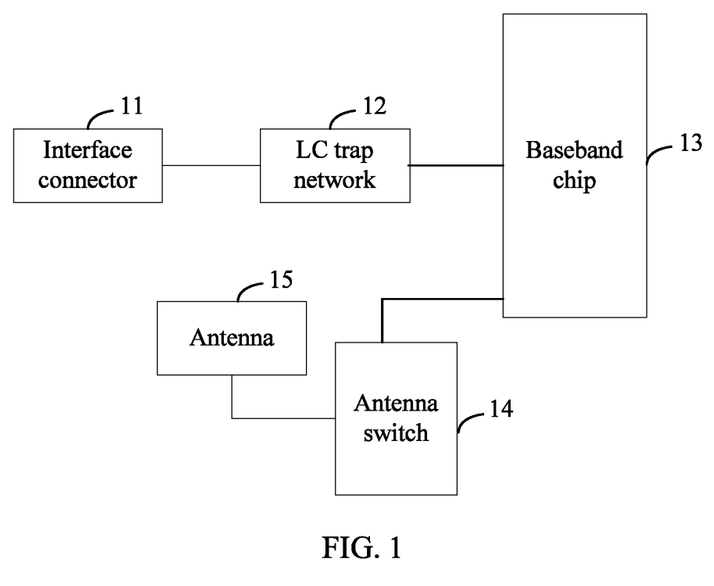
FIG. 1 is a schematic structural diagram of an existing harmonic suppression system.

Due to a trend of miniaturization of current mobile broadband products and an increasingly complicated electromagnetic environment around an antenna, an antenna signal is generally subject to interference from a second harmonic. For that reason, signal interference caused by the second harmonic may be generally suppressed by setting an LC (inductor-capacitor) trap network. FIG. 1 is a schematic structural diagram of an existing harmonic suppression system. As shown in FIG. 1, the system includes an interface connector 11, an LC trap network 12, a baseband chip 13, an antenna switch 14, and an antenna 15, where the LC trap network 12 is connected between the interface connector 11 and the baseband chip 13, and configured to suppress a second harmonic that occurs when an operating frequency band of the antenna 15 is a frequency band corresponding to the LC trap network 12; and the antenna switch 14 is connected between the baseband chip 13 and the antenna 15, and configured to enable the baseband chip 13 to control the operating frequency band of the antenna 15 using the antenna switch 14.

As shown in FIG. 1, suppression of a second harmonic in a case of this frequency band can be implemented using this solution only when the operating frequency band of the antenna 15 is the frequency band corresponding to the LC trap network 12. However, the operating frequency band of the antenna 15 may generally cover multiple frequency bands; therefore, based on the foregoing existing solution, when the operating frequency band of the antenna 15 is another frequency band, suppression of a second harmonic in a case of the another frequency band cannot be implemented using the LC trap network 12.

SUMMARY

The present disclosure provides a harmonic suppression system configured to resolve a problem that suppression of a second harmonic cannot be implemented on multiple frequency bands using an existing harmonic suppression solution.

According to a first aspect, the present disclosure provides a harmonic suppression system, including an interface connector, a baseband chip, an antenna, and an antenna switch, where the system further includes at least two LC trap networks, a first differential single-pole multi-throw (SPMT) switch, and a second differential single-pole multi-throw SPMT switch, where the interface connector is connected to a common end of the first differential SPMT switch; a control port of the first differential SPMT switch is connected to a control port of the second differential SPMT switch, and each gating throw end of multiple gating throw ends of the first differential SPMT switch is separately connected to one end of each LC trap network of the at least two LC trap networks in a one-to-one correspondence; the control port of the second differential SPMT switch is connected to the baseband chip, each gating throw end of multiple gating throw ends of the second differential SPMT switch is separately connected to the other end of each LC trap network of the at least two LC trap networks in a one-to-one correspondence, and a common end of the second differential SPMT switch is connected to the baseband chip; the baseband chip is connected to the antenna switch, and the antenna switch is connected to the antenna; the baseband chip is configured to determine an operating frequency band of the antenna, and if it is determined that the operating frequency band is one of multiple preset frequency bands, send a preset gating control signal corresponding to the operating frequency band to the control port of the first differential SPMT switch and to the control port of the second differential SPMT switch, where each frequency band of the multiple frequency bands is in a one-to-one correspondence with each LC trap network of the at least two LC trap networks; the first differential SPMT switch is configured to electrically connect, according to the gating control signal, the interface connector and an LC trap network corresponding to the operating frequency band; and the second differential SPMT switch is configured to electrically connect, according to the gating control signal, the baseband chip and the LC trap network corresponding to the operating frequency band.

According to the first aspect, in a first implementable manner of the first aspect, the first differential SPMT switch and the second differential SPMT switch further include straight-through throw ends, and a straight-through throw end of the first differential SPMT switch is connected to a straight-through throw end of the second differential SPMT switch; the baseband chip is further configured to, if it is determined that the operating frequency band is not any one of the multiple frequency bands, send a straight-through control signal to the control port of the first differential SPMT switch and to the control port of the second differential SPMT switch; the first differential SPMT switch electrically connects the interface connector and the straight-through throw end of the first differential SPMT switch according to the straight-through control signal; and the second differential SPMT switch electrically connects the baseband chip and the straight-through throw end of the second differential SPMT switch according to the straight-through control signal.

According to the first aspect or the first implementable manner of the first aspect, in a second implementable manner of the first aspect, the baseband chip is further configured to send, after the operating frequency band of the antenna is determined, a preset antenna switch control signal corresponding to the operating frequency band to a control port of the antenna switch, so that the antenna switch switches a frequency band of an operating signal of the antenna to the operating frequency band according to the antenna switch control signal.

According to the first aspect or either of the first two implementable manners of the first aspect, in a third implementable manner of the first aspect, each LC trap network includes an LC trap circuit, a first port connected to the gating throw end of the first differential SPMT switch, and a second port connected to the gating throw end of the second differential SPMT switch, where the first port includes a first positive port and a first negative port, and the second port includes a second positive port and a second negative port; the LC trap circuit includes a first LC trap subcircuit connected between the first positive port and the second positive port and a second LC trap subcircuit connected between the first negative port and the second negative port; the first LC trap subcircuit includes a first LC parallel circuit and a first capacitor, one end of the first capacitor is connected to a low electrical level, the other end of the first capacitor is connected to the first positive port and to one end of the first LC parallel circuit, and the other end of the first LC parallel circuit is connected to the second positive port; and the second LC trap subcircuit includes a second LC parallel circuit and a second capacitor, one end of the second capacitor is connected to a low electrical level, the other end of the second capacitor is connected to the first negative port and to one end of the second LC parallel circuit, and the other end of the second LC parallel circuit is connected to the second negative port, where an inductor in the first LC parallel circuit and an inductor in the second LC parallel circuit are the same in parameter, a capacitor in the first LC parallel circuit and a capacitor in the second LC parallel circuit are the same in parameter, and the first capacitor and the second capacitor are the same in parameter.

According to the first aspect or one of the first three implementable manners of the first aspect, in a fourth implementable manner of the first aspect, the interface connector is a universal serial bus (USB) connector.

According to the harmonic suppression system provided by the present disclosure, a gating control signal corresponding to a current operating frequency band of an antenna is sent to a first differential SPMT switch and a second differential SPMT switch, and therefore, an LC trap network that is corresponding to the operating frequency band and set between an interface connector and a baseband chip is electrically connected by controlling turning on and turning off of the first differential SPMT switch and the second differential SPMT switch, so that for multiple different operating frequency bands of the antenna, suppression of a second harmonic may be implemented using corresponding LC trap networks.

DESCRIPTION OF EMBODIMENTS

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Figure 2:
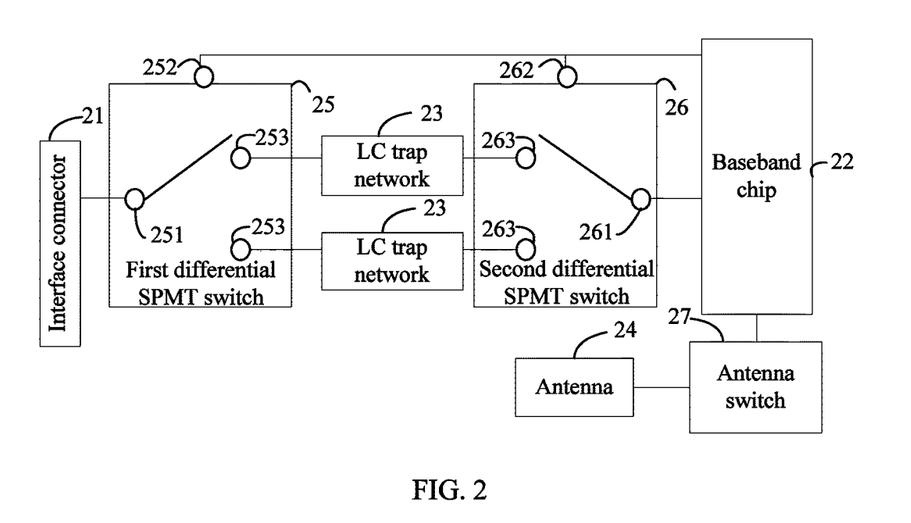
FIG. 2 is a schematic structural diagram of a harmonic suppression system according to Embodiment 1 of the present disclosure.

FIG. 2 is a schematic structural diagram of a harmonic suppression system according to Embodiment 1 of the present disclosure. As shown in FIG. 2, the system includes an interface connector 21, a baseband chip 22, at least two LC trap networks 23, an antenna 24, a first differential SPMT switch 25, a second differential SPMT switch 26, and an antenna switch 27, where the interface connector 21 is connected to a common end 251 of the first differential SPMT switch 25; a control port 252 of the first differential SPMT switch 25 is connected to a control port 262 of the second differential SPMT switch 26, and each gating throw end of multiple gating throw ends 253 of the first differential SPMT switch 25 is separately connected to one end of each LC trap network of the at least two LC trap networks 23 in a one-to-one correspondence; the control port 262 of the second differential SPMT switch 26 is connected to the baseband chip 22, each gating throw end of multiple gating throw ends 263 of the second differential SPMT switch 26 is separately connected to the other end of each LC trap network of the at least two LC trap networks 23 in a one-to-one correspondence, and a common end 261 of the second differential SPMT switch 26 is connected to the baseband chip 22; the baseband chip 22 is connected to the antenna switch 27, and the antenna switch 27 is connected to the antenna 24; the baseband chip 22 is configured to determine an operating frequency band of the antenna 24, and if it is determined that the operating frequency band is one of multiple preset frequency bands, send a preset gating control signal corresponding to the operating frequency band to the control port 252 of the first differential SPMT switch 25 and to the control port 262 of the second differential SPMT switch 26, where each frequency band of the multiple frequency bands is in a one-to-one correspondence with each LC trap network of the at least two LC trap networks 23; the first differential SPMT switch 25 is configured to electrically connect, according to the gating control signal corresponding to the operating frequency band, the interface connector 21 and an LC trap network corresponding to the operating frequency band; and the second differential SPMT switch 26 is configured to electrically connect, according to the gating control signal corresponding to the operating frequency band, the baseband chip 22 and the LC trap network corresponding to the operating frequency band.

The interface connector 21 may be a USB connector, or a Secure Digital Input and Output card (SDIO) connector, which is not limited herein in the embodiment.

After the baseband chip 22 determines the operating frequency band of the antenna 24, if the operating frequency band is one of the multiple preset frequency bands that are in a one-to-one correspondence with the multiple LC trap networks 23, that is, among the multiple LC trap networks 23, there is an LC trap network corresponding to the operating frequency band, the baseband chip 22 may send the gating control signal to the control port 252 of the first differential SPMT switch 25 and to the control port 262 of the second differential SPMT switch 26; the first differential SPMT switch 25, under a control of the gating control signal, electrically connects the common end 251 of the first differential SPMT switch 25 and a gating throw end that is corresponding to the gating control signal and that is of the multiple gating throw ends 253 of the first differential SPMT switch 25, and the gating throw end that is corresponding to the gating control signal and of the first differential SPMT switch 25 is connected to the one end of the LC trap network corresponding to the operating frequency band; and the second differential SPMT switch 26, under a control of the gating control signal, electrically connects the common end 261 of the second differential SPMT switch 26 and a gating throw end that is corresponding to the gating control signal and that is of the multiple gating throw ends 263 of the second differential SPMT switch 26, and the gating throw end that is corresponding to the gating control signal and of the second differential SPMT switch 26 is connected to the other end of the LC trap network corresponding to the operating frequency band.

The LC trap network corresponding to the operating frequency band is connected between the interface connector 21 and the baseband chip 22 using the first differential SPMT switch 25 and the second differential SPMT switch 26, and further a second harmonic in a case of the operating frequency band is effectively suppressed using the LC trap network corresponding to the operating frequency band.

In an actual application, which frequency bands are supported by an antenna is preset when the antenna is designed and manufactured. Correspondingly, a method for determining an operating frequency band of the antenna 24 may generally include using, by the baseband chip 22 according to a frequency band supported by a communications network that currently needs establish a communication connection, the frequency band supported by the communications network as the operating frequency band of the antenna 24.

It should be noted that the figure shows only a specific implementation manner of the embodiment, and does not impose any limitations on the embodiment. For example, a quantity of LC trap networks 23 in the embodiment includes but is not limited to two shown in the figure, and correspondingly, a quantity of gating throw ends that are of the first differential SPMT switch 25 and that are of the second differential SPMT switch 26 is not limited to a quantity shown in the figure, either.

In an actual application, although an LC trap network may implement suppression of a second harmonic, due to a circuit characteristic of the LC trap network itself, when the LC trap network is set, an undesirable phenomenon such as deterioration of an eye diagram of a signal or an increase of intersymbol interference generally occurs; in addition, a capacitor and an inductor that are on the LC trap network are generally not ideal devices; therefore, corresponding equivalent direct current resistance exists, which also causes unnecessary signal attenuation. In addition, in an actual application, a second harmonic phenomenon generally occurs only when an operating frequency band is a low-frequency band; therefore, when an operating frequency band of an antenna is in a high-frequency band, generally, it is not required to perform suppression of a second harmonic.

Figure 3:
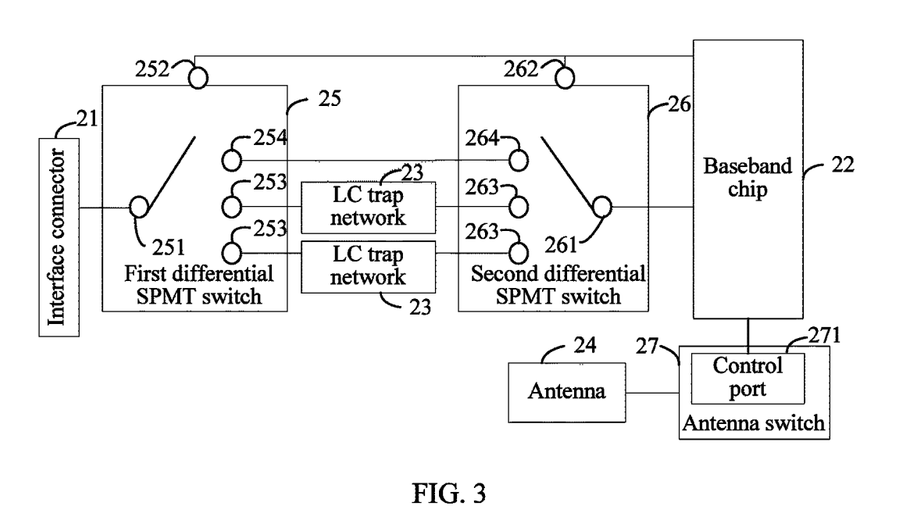
FIG. 3 is a schematic structural diagram of another harmonic suppression system according to Embodiment 2 of the present disclosure.

Therefore, in order to avoid the foregoing series of problems caused by an LC trap network that is still set when suppression of a second harmonic is not required to be performed on an antenna, optionally, FIG. 3 is a schematic structural diagram of another harmonic suppression system according to Embodiment 2 of the present disclosure. As shown in FIG. 3, according to the harmonic suppression system described in Embodiment 1, the first differential SPMT switch 25 and the second differential SPMT switch 26 further include straight-through throw ends, and a straight-through throw end 254 of the first differential SPMT switch 25 is connected to a straight-through throw end 264 of the second differential SPMT switch 26; the baseband chip 22 is further configured to send, after the operating frequency band of the antenna is determined, if it is determined that the operating frequency band is not any one of the multiple frequency bands, a straight-through control signal to the control port 252 of the first differential SPMT switch 25 and to the control port 262 of the second differential SPMT switch 26; the first differential SPMT switch 25 electrically connects the interface connector 21 and the straight-through throw end 254 of the first differential SPMT switch 25 according to the straight-through control signal; and the second differential SPMT switch 26 electrically connects the baseband chip 22 and the straight-through throw end 264 of the second differential SPMT switch 26 according to the straight-through control signal. After the operating frequency band of the antenna 24 is determined, if the operating frequency band is not any one of the multiple frequency bands, that is, among the multiple LC trap networks 23, there is no LC trap network corresponding to the frequency band, the baseband chip 22 may send the straight-through control signal to the first differential SPMT switch 25 and to the second differential SPMT switch 26, where the straight-through control signal is used to enable the first differential SPMT switch 25 and the second differential SPMT switch 26 to electrically connect, under a control of the straight-through control signal, the straight-through throw end 254 of the first differential SPMT switch 25 and the straight-through throw end 264 that is of the second differential SPMT switch 26 and that is directly connected to the straight-through throw end 254, so that no LC trap network is connected between the interface connector 21 and the baseband chip 22 using the first differential SPMT switch 25 and the second differential SPMT switch 26.

In addition, in an actual application, after the baseband chip 22 determines the operating frequency band of the antenna 24, in order to control the operating frequency band of the antenna 24, optionally, in another implementable manner of the embodiment or Embodiment 1, the baseband chip 22 is further configured to send, after the operating frequency band of the antenna 24 is determined, a preset antenna switch control signal corresponding to the operating frequency band to the antenna switch 27, so that the antenna switch 27 switches a frequency band of an operating signal of the antenna 24 to the operating frequency band according to the antenna switch control signal.

The baseband chip 22 is connected to a control port 271 of the antenna switch 27, and is configured to send, after the operating frequency band of the antenna 24 is determined, the preset antenna switch control signal corresponding to the operating frequency band to the control port 271 of the antenna switch 27.

Figure 4:
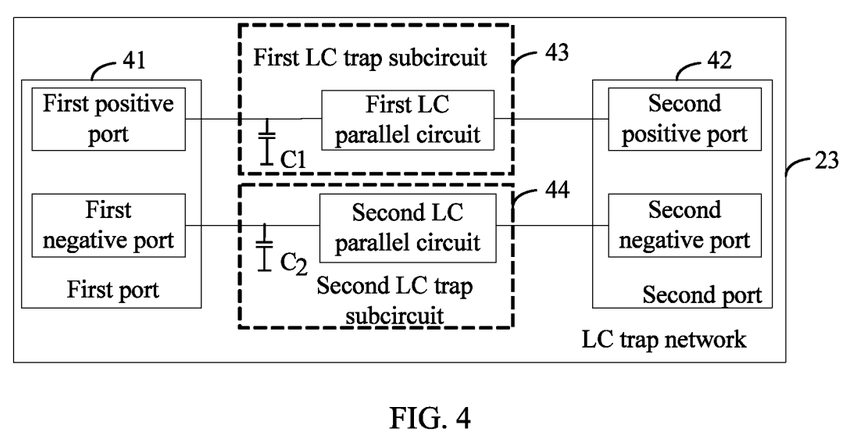
FIG. 4 is a schematic structural diagram of an LC trap network 23 according to any embodiment of the present disclosure.

Further, FIG. 4 is a schematic structural diagram of the LC trap network 23 according to any embodiment of the present disclosure. In any one of the foregoing embodiments, each LC trap network 23 may include an LC trap circuit, a first port 41 connected to a gating throw end of the first differential SPMT switch 25, and a second port 42 connected to a gating throw end of the second differential SPMT switch 26, where the first port 41 includes a first positive port and a first negative port, and the second port 42 includes a second positive port and a second negative port; the LC trap circuit includes a first LC trap subcircuit 43 connected between the first positive port and the second positive port and a second LC trap subcircuit 44 connected between the first negative port and the second negative port; the first LC trap subcircuit 43 includes a first LC parallel circuit and a first capacitor C1, one end of C1 is connected to a low electrical level, the other end of C1 is connected to the first positive port and to one end of the first LC parallel circuit, and the other end of the first LC parallel circuit is connected to the second positive port; and the second LC trap subcircuit 44 includes a second LC parallel circuit and a second capacitor C2, one end of C2 is connected to a low electrical level, the other end of C2 is connected to the first negative port and to one end of the second LC parallel circuit, and the other end of the second LC parallel circuit is connected to the second negative port.

An inductor in the first LC parallel circuit and an inductor in the second LC parallel circuit are the same in parameter, a capacitor in the first LC parallel circuit and a capacitor in the second LC parallel circuit are the same in parameter, and the first capacitor and the second capacitor are the same in parameter.

Parameters of the devices in the LC trap circuit may be determined according to the operating frequency band, and a specific method for determining is not described herein again. The LC parallel circuit includes a capacitor and an inductor, and the capacitor and the inductor are in parallel.

Persons of ordinary skill in the art may understand that all or some of the steps of the foregoing method embodiments may be implemented by a program instructing relevant hardware. The program may be stored in a computer-readable storage medium. When the program runs, the steps of the method embodiments are performed. The foregoing storage medium includes any medium that can store program code, such as a read-only memory (ROM), a random access memory (RAM), a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A harmonic suppression system, comprising:
   an interface connector;
   a baseband chip;
   an antenna;
   an antenna switch;
   at least two LC trap networks;
   a first differential single-pole multi-throw (SPMT) switch; and
   a second differential single-pole multi-throw, SPMT, switch, wherein the interface connector is connected to a common end of the first differential SPMT switch,
   wherein a control port of the first differential SPMT switch is connected to a control port of the second differential SPMT switch, the control port of the second differential SPMT switch is connected to the baseband chip, and each gating throw end of multiple gating throw ends of the first differential SPMT switch is connected to each gating throw end of multiple gating throw ends of the second differential SPMT switch in a one-to-one correspondence separately using each LC wave trap network of the at least two LC trap networks,
   wherein a common end of the second differential SPMT switch is connected to the baseband chip,
   wherein the baseband chip is connected to the antenna using the antenna switch; the baseband chip is configured to determine an operating frequency band of the antenna, and if it is determined that the operating frequency band is one of multiple preset frequency bands, send a preset gating control signal corresponding to the operating frequency band to the control port of the first differential SPMT switch and to the control port of the second differential SPMT switch, wherein each frequency band of the multiple preset frequency bands is in a one-to-one correspondence with each LC trap network of the at least two LC trap networks,
   wherein the first differential SPMT switch is configured to electrically connect, according to the preset gating control signal, the interface connector and an LC trap network corresponding to the operating frequency band, and
   wherein the second differential SPMT switch is configured to electrically connect, according to the preset gating control signal, the baseband chip and the LC trap network corresponding to the operating frequency band.

2. The system according to claim 1, wherein the first differential SPMT switch and the second differential SPMT switch further comprise straight-through throw ends, and a straight-through throw end of the first differential SPMT switch is connected to a straight-through throw end of the second differential SPMT switch,
   wherein the baseband chip is further configured to send a straight-through control signal to the control port of the first differential SPMT switch and to the control port of the second differential SPMT switch when it is determined that the operating frequency band is not any one of the multiple preset frequency bands,
   wherein the first differential SPMT switch electrically connects the interface connector and the straight-through throw end of the first differential SPMT switch according to the straight-through control signal, and
   wherein the second differential SPMT switch electrically connects the baseband chip and the straight-through throw end of the second differential SPMT switch according to the straight-through control signal.

3. The system according to claim 2, wherein the baseband chip is connected to the antenna using a control port of the antenna switch, and wherein the baseband chip is further configured to send, after the operating frequency band of the antenna is determined, a preset antenna switch control signal corresponding to the operating frequency band to the control port of the antenna switch, such that the antenna switch switches a frequency band of an operating signal of the antenna to the operating frequency band according to the preset antenna switch control signal.

4. The system according to claim 2, wherein each LC trap network comprises:
   an LC trap circuit;
   a first port connected to the gating throw end of the first differential SPMT switch; and
   a second port connected to the gating throw end of the second differential SPMT switch, wherein the first port comprises a first positive port and a first negative port, and the second port comprises a second positive port and a second negative port, wherein the LC trap circuit comprises a first LC trap subcircuit connected between the first positive port and the second positive port and a second LC trap subcircuit connected between the first negative port and the second negative port, wherein the first LC trap subcircuit comprises a first LC parallel circuit and a first capacitor, wherein one end of the first capacitor is connected to a low electrical level, wherein the other end of the first capacitor is connected to the first positive port and to one end of the first LC parallel circuit, wherein the other end of the first LC parallel circuit is connected to the second positive port, wherein the second LC trap subcircuit comprises a second LC parallel circuit and a second capacitor, wherein one end of the second capacitor is connected to a low electrical level, wherein the other end of the second capacitor is connected to the first negative port and to one end of the second LC parallel circuit, wherein the other end of the second LC parallel circuit is connected to the second negative port, wherein an inductor in the first LC parallel circuit and an inductor in the second LC parallel circuit are the same in parameter, wherein a capacitor in the first LC parallel circuit and a capacitor in the second LC parallel circuit are the same in parameter, and wherein the first capacitor and the second capacitor are the same in parameter.

5. The system according to claim 3, wherein each LC trap network comprises:
an LC trap circuit;
a first port connected to the gating throw end of the first differential SPMT switch; and
a second port connected to the gating throw end of the second differential SPMT switch, wherein the first port comprises a first positive port and a first negative port, and the second port comprises a second positive port and a second negative port, wherein the LC trap circuit comprises a first LC trap subcircuit connected between the first positive port and the second positive port and a second LC trap subcircuit connected between the first negative port and the second negative port, wherein the first LC trap subcircuit comprises a first LC parallel circuit and a first capacitor, wherein one end of the first capacitor is connected to a low electrical level, wherein the other end of the first capacitor is connected to the first positive port and to one end of the first LC parallel circuit, wherein the other end of the first LC parallel circuit is connected to the second positive port, wherein the second LC trap subcircuit comprises a second LC parallel circuit and a second capacitor, wherein one end of the second capacitor is connected to a low electrical level, wherein the other end of the second capacitor is connected to the first negative port and to one end of the second LC parallel circuit, wherein the other end of the second LC parallel circuit is connected to the second negative port, wherein an inductor in the first LC parallel circuit and an inductor in the second LC parallel circuit are the same in parameter, wherein a capacitor in the first LC parallel circuit and a capacitor in the second LC parallel circuit are the same in parameter, and wherein the first capacitor and the second capacitor are the same in parameter.

6. The system according to claim 1, wherein the baseband chip is connected to the antenna using a control port of the antenna switch, and wherein the baseband chip is further configured to send, after the operating frequency band of the antenna is determined, a preset antenna switch control signal corresponding to the operating frequency band to the control port of the antenna switch, such that the antenna switch switches a frequency band of an operating signal of the antenna to the operating frequency band according to the preset antenna switch control signal.

7. The system according to claim 6, wherein each LC trap network comprises:
an LC trap circuit;
a first port connected to the gating throw end of the first differential SPMT switch; and
a second port connected to the gating throw end of the second differential SPMT switch, wherein the first port comprises a first positive port and a first negative port, and the second port comprises a second positive port and a second negative port, wherein the LC trap circuit comprises a first LC trap subcircuit connected between the first positive port and the second positive port and a second LC trap subcircuit connected between the first negative port and the second negative port, wherein the first LC trap subcircuit comprises a first LC parallel circuit and a first capacitor, wherein one end of the first capacitor is connected to a low electrical level, wherein the other end of the first capacitor is connected to the first positive port and to one end of the first LC parallel circuit, wherein the other end of the first LC parallel circuit is connected to the second positive port, wherein the second LC trap subcircuit comprises a second LC parallel circuit and a second capacitor, wherein one end of the second capacitor is connected to a low electrical level, wherein the other end of the second capacitor is connected to the first negative port and to one end of the second LC parallel circuit, wherein the other end of the second LC parallel circuit is connected to the second negative port, wherein an inductor in the first LC parallel circuit and an inductor in the second LC parallel circuit are the same in parameter, wherein a capacitor in the first LC parallel circuit and a capacitor in the second LC parallel circuit are the same in parameter, and wherein the first capacitor and the second capacitor are the same in parameter.

8. The system according to claim 1, wherein each LC trap network comprises:
an LC trap circuit;
a first port connected to the gating throw end of the first differential SPMT switch; and
a second port connected to the gating throw end of the second differential SPMT switch, wherein the first port comprises a first positive port and a first negative port, and the second port comprises a second positive port and a second negative port, wherein the LC trap circuit comprises a first LC trap subcircuit connected between the first positive port and the second positive port and a second LC trap subcircuit connected between the first negative port and the second negative port, wherein the first LC trap subcircuit comprises a first LC parallel circuit and a first capacitor, wherein one end of the first capacitor is connected to a low electrical level, wherein the other end of the first capacitor is connected to the first positive port and to one end of the first LC parallel circuit, and wherein the other end of the first LC parallel circuit is connected to the second positive port, wherein the second LC trap subcircuit comprises a second LC parallel circuit and a second capacitor, wherein one end of the second capacitor is connected to a low electrical level, wherein the other end of the second capacitor is connected to the first negative port and to one end of the second LC parallel circuit, wherein the other end of the second LC parallel circuit is connected to the second negative port, wherein an inductor in the first LC parallel circuit and an inductor in the second LC parallel circuit are the same in parameter, wherein a capacitor in the first LC parallel circuit and a capacitor in the second LC parallel circuit are the same in parameter, and wherein the first capacitor and the second capacitor are the same in parameter.

9. The system according to claim 1, wherein the interface connector is a Universal Serial Bus (USB) connector.

* * * * *